United States Patent [19]

Evans

[11] Patent Number: 5,445,532
[45] Date of Patent: Aug. 29, 1995

[54] REUSABLE VIBRATION RESISTANT INTEGRATED CIRCUIT MOUNTING SOCKET

[75] Inventor: Craig N. Evans, Irwin, Pa.

[73] Assignee: The United States of America as represented by the United States Department of Energy, Washington, D.C.

[21] Appl. No.: 136,069

[22] Filed: Oct. 14, 1993

[51] Int. Cl.6 .......................................... H01R 13/20
[52] U.S. Cl. .................................... 439/161; 439/70; 439/485
[58] Field of Search ................ 439/161, 70, 441, 485, 439/206

[56] References Cited

FOREIGN PATENT DOCUMENTS 0170384 7/1990 Japan .................................. 439/161

OTHER PUBLICATIONS

IBM Technical Disclosure Bulletin, vol. 30, No. 11 pp. 24–25 Apr. 1988.

*Primary Examiner*—Z. R. Bilinsky
*Attorney, Agent, or Firm*—John T. Lucas; William R. Moser; Judson R. Hightower

[57] ABSTRACT

This invention discloses a novel form of socket for integrated circuits to be mounted on printed circuit boards. The socket uses a novel contact which is fabricated out of a bimetallic strip with a shape which makes the end of the strip move laterally as temperature changes. The end of the strip forms a barb which digs into an integrated circuit lead at normal temperatures and holds it firmly in the contact, preventing loosening and open circuits from vibration. By cooling the contact containing the bimetallic strip the barb end can be made to release so that the integrated circuit lead can be removed from the socket without damage either to the lead or to the socket components.

2 Claims, 4 Drawing Sheets

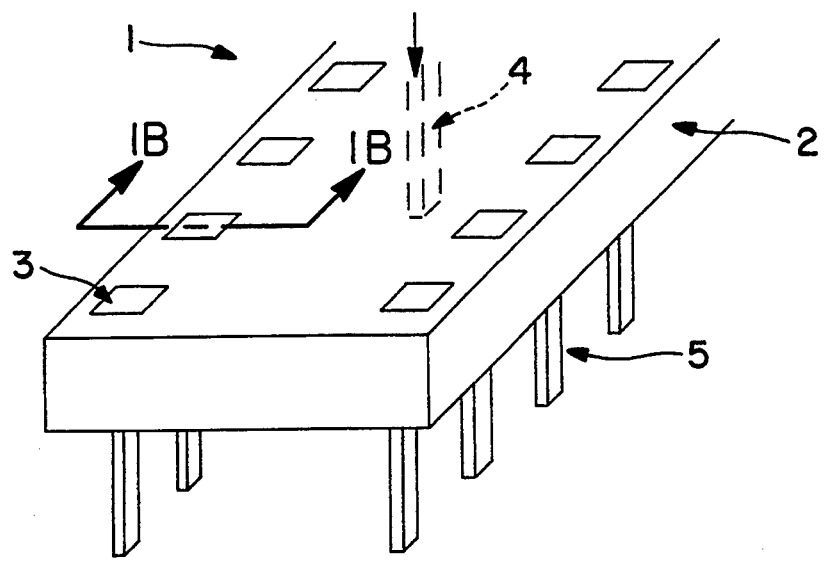
FIG. IA
PRIOR ART
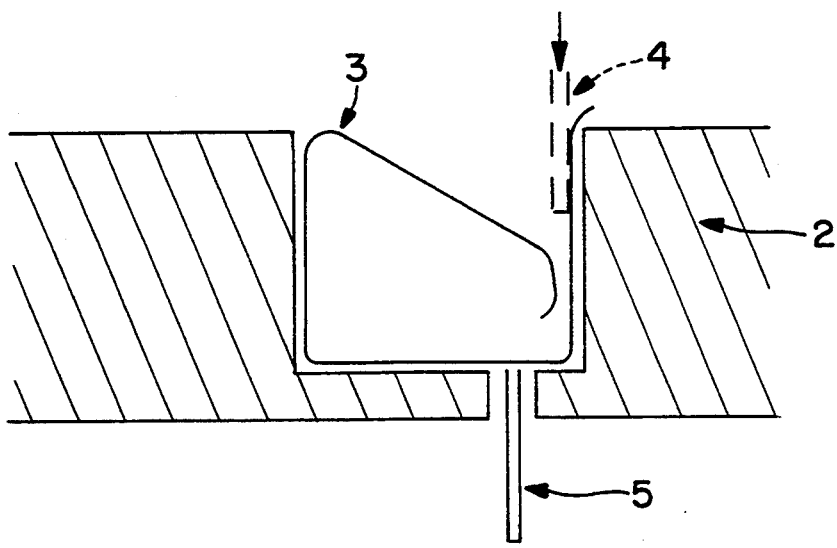
FIG. IB
PRIOR ART

REUSABLE VIBRATION RESISTANT INTEGRATED CIRCUIT MOUNTING SOCKET

SUMMARY OF THE INVENTION

The current invention is a novel design for an integrated circuit (IC) connector socket that is simultaneously reusable and shock and vibration resistant by virtue of temperature activated mechanical means to make electrical contact with the IC leads. The socket comprises a plastic body containing metal spring contacts which grip each of the IC leads and extensions from the spring contacts which are used to create electrical connections with the balance of the circuit. The socket contacts are barb-shaped so that the gripping force on the IC lead increases if the IC begins to fall out or shake out of the socket due to vibration or shock. The socket contacts are made of plated bimetallic strips which are in firm contact with the IC leads over the design temperature range of the electrical circuit. The IC is removed by cooling the socket below the minimum design temperature of the circuit. The cooling causes the spring contacts to retract and release the grip of their barbs on the IC leads. Thus this design combines a vibration resistant barb-type spring contact with the reusability of traditional sockets by means of a new temperature activated bimetallic contact design.

BACKGROUND OF THE INVENTION

The environment experienced by integrated circuits and printed circuit boards in both industrial and military applications require them to withstand substantial shock and vibration. The method of mounting an integrated circuit (IC) on a printed circuit board must enable the connections to withstand substantial shock and vibration because these forces can cause an IC mounting device to loosen, open the connection, and thereby result in failure of the circuit.

There are two generally distinct types of IC connections, reusable and non-reusable. Non-reusable connections are sometimes hard soldered. Soldered connections are inherently vibration and shock proof because the mechanical connection is through solidified metal. However, they do not permit flexibility in the maintenance of the circuit. Another type of non-reusable connection is through vibration and shock resistant sockets. Such sockets available before the present invention are not reusable because the mechanical design of the contact necessary to keep the IC lead in the socket under shock and vibration inherently involves damage to the socket contacts when the IC leads are intentionally removed from the socket.

The other main type of socket is the reusable socket. Such sockets are becoming much more common in printed circuit design since sockets permit the IC to be removed for troubleshooting or replacement without the risk of damage to the IC due to the heat necessary for desoldering a soldered in device. Unfortunately reusable sockets known in the prior art are not vibration and shock resistant because the metal contacts inside the socket that grip the IC leads are designed to release the IC leads without harm.

As shown in FIGS. 1A and 1B, current reusable IC socket designs (1) employ spring contacts (3) to grasp the IC leads but the contacts are designed only to pinch the leads and can release the lead as a result of shock or vibration. The prior art socket comprises the plastic body (2), metal contacts (3) that grasp each IC lead (4), and contact extensions (5) that pass through the circuit board to be used for electrical connection to the balance of circuit.

Current vibration resistant IC socket designs, as shown in FIGS. 2A and 2B, employ spring contacts that are shaped like a barb (10). The IC lead (11) enters the socket contact (12) easily but when the user attempts to remove the IC lead from the socket the socket contact is damaged to the point that the socket is not reusable.

Because both manufacturing and maintenance of circuits and circuit boards need to be more flexible in a world where vast quantities of circuits using board-mounted IC's are produced, a need exists for an IC connector socket which is simultaneously reusable and vibration and shock resistant. This invention is responsive to that need.

BRIEF DESCRIPTION OF THE DRAWINGS

FIG. 1A shows an isometric view of the standard prior art reusable socket.

FIG. 1B shows the spring contact employed in the standard prior art reusable socket.

DETAILED DESCRIPTION OF PREFERRED EMBODIMENT

The current invention is a reusable IC socket that is highly resistant to shock and vibration induced loosening of the connection between the IC lead and the socket because the vibration-resistant barb-shaped socket contacts open or close on the IC leads as a function of temperature. The contact is fabricated from a bimetallic strip and the temperature dependent behavior of the bimetallic strip enables the socket contacts to grip firmly the IC leads over the circuit design temperature range. The contacts release their grip when the socket is cooled below the minimum design temperature of the circuit, thereby allowing the IC to be removed from the socket without damaging either the socket contact or the IC lead.

This invention employs a barb-type contact (10) in the socket that maintains a tight and vibration-resistant grip on the IC leads in the range of design temperatures. The design temperature range of the electrical circuit or panel is defined by the minimum storage temperature and the maximum allowable operating temperature of the IC. The minimum storage temperature is lower than the minimum operating temperature since the electrical components generate heat during operation. The spring contact is made of bimetallic material so that when the socket is cooled below a design minimum temperature typically at or just below the minimum storage temperature, the contact barb retracts and releases its grip on the IC lead. The IC is then removed without damaging the socket contacts or the IC leads.

Figure 3A:
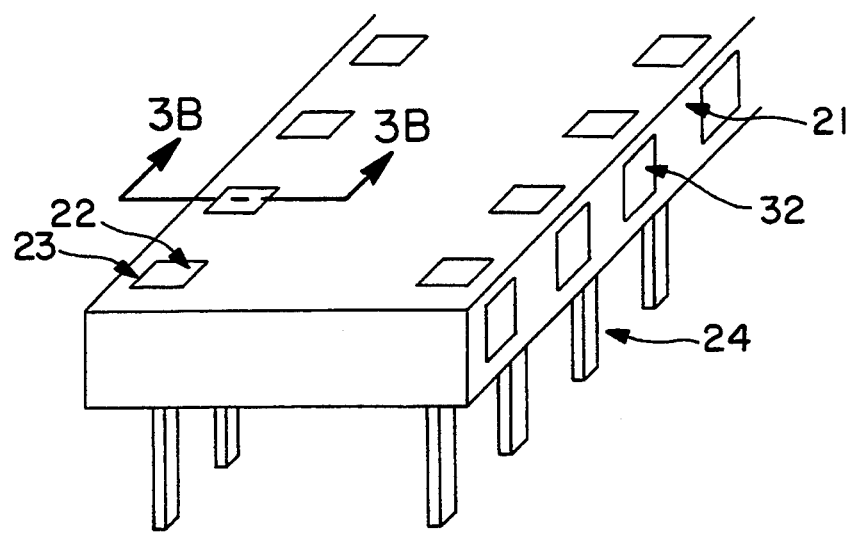
FIG. 3A shows an isometric view of a socket of the present invention.
Figure 3B:
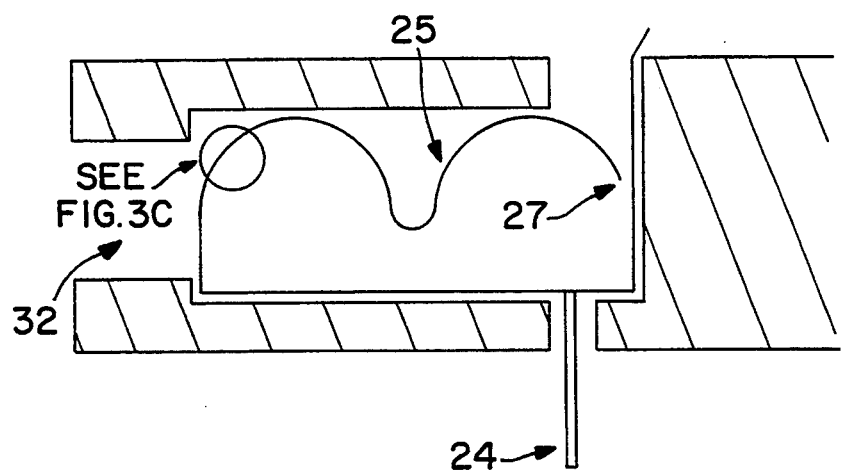
FIG. 3B shows a preferred embodiment for a socket contact of the present invention.
Figure 3C:
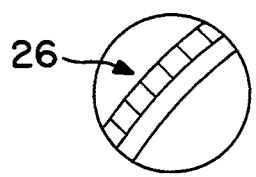
FIG. 3C is a close-up of a cross-section of the bi-metallic contact of the present invention.

This temperature activated vibration-resistant socket design, FIGS. 3A and 3B, comprises a plastic body (21) that houses metal contacts (22) which in turn grasp the IC leads by means of barbed ends. There is one spring contact for each lead of the IC. The spring contacts are inserted in individual holes (23) cast in the body of the socket, and metal contact extensions (24) are rigidly connected to or integral with the contact and protrude below the body. The extensions are used to connect the IC socket with the remainder of the circuit. The bimetallic spring contacts (25) are made of bimetallic strips (26) such as aluminum/phosphor bronze or aluminum/nickel-steel and are plated with an appropriate metal, e.g., tin, gold, silver, to improve the electrical contact with the IC lead. The materials should be carefully chosen in each particular combination to minimize dissimilar-metal corrosion.

Figure 2A:
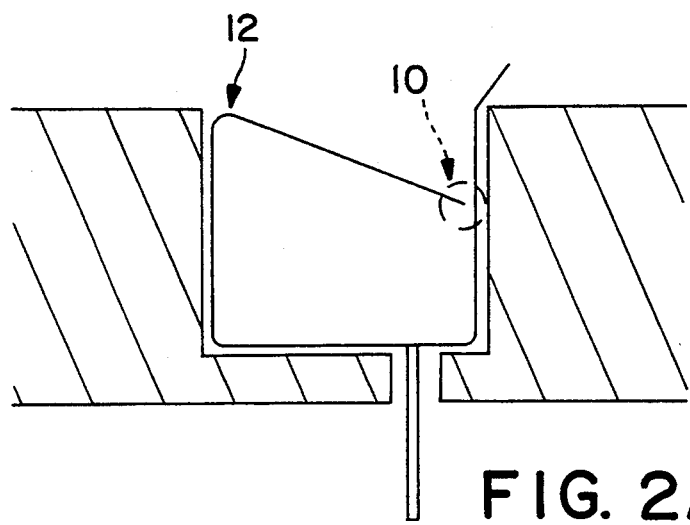
FIG. 2A shows the socket contact employed in the prior art non-reusable vibration and shock resistant socket, with no IC installed.
Figure 2B:
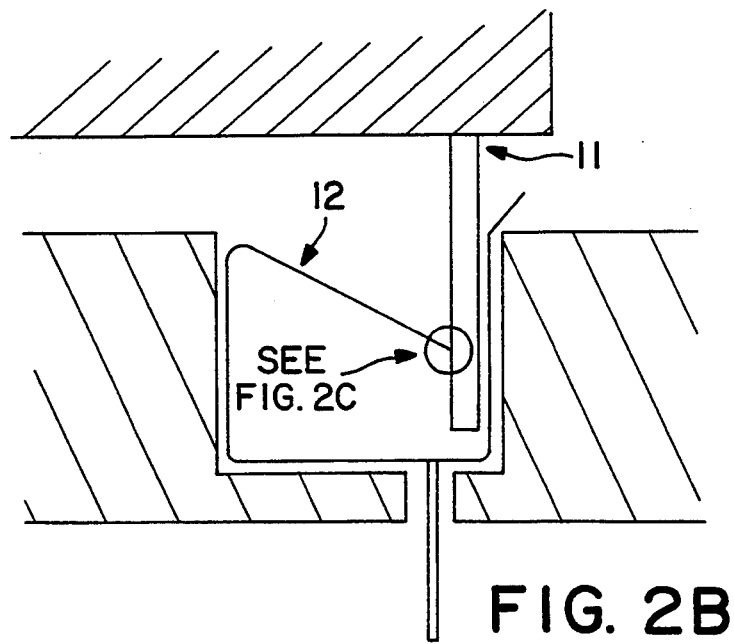
FIG. 2B shows the socket contact employed in the prior art non-reusable vibration and shock resistant socket, with an IC installed.
Figure 2C:
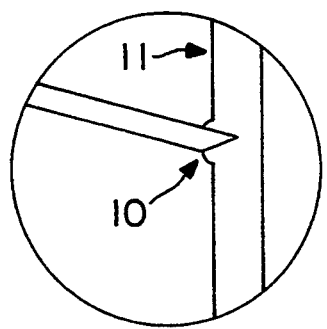
FIG. 2C is a close-up view of the contact employed in the prior art non-reusable vibration and shock resistant socket, with an IC installed.
Figure 4A:
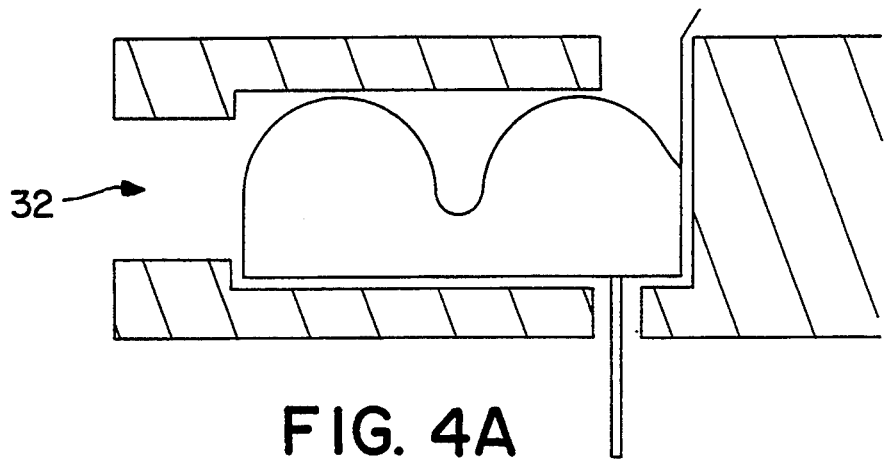
FIG. 4A shows a contact configuration of the present invention at minimum design temperature, with no IC installed.

The end of the contact with the barbed end (27) is turned away from the socket entrance so that it grips the inserted IC lead in the same manner as does the non-reusable contact shown in FIG. 2B. Within the design temperature range because the bimetallic contact just touches the side contact, as shown in FIG. 4A, the IC lead may be easily inserted but the lead cannot be removed from the socket without deforming the spring contact. During shock and vibration of the circuit board, the spring contact will retain the IC lead by virtue of the wedging or jamming action that occurs. The contact dimensions are designed so that the barb end of the contact will stay in contact with the IC lead over the design temperature range of the circuit board. As the socket temperature increases, the contact lengthens and the contact force on the IC lead increases.

Figure 4B:
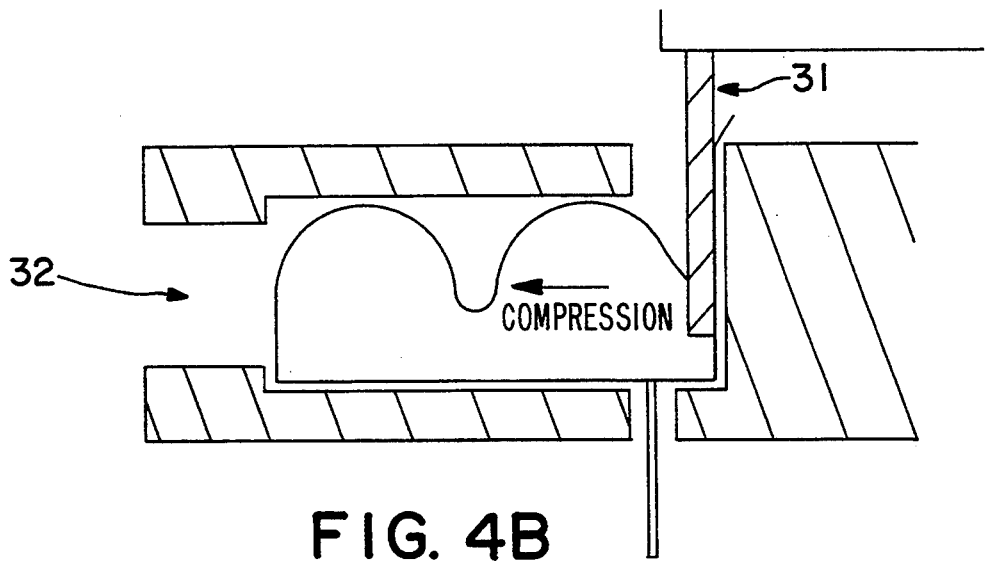
FIG. 4B shows a contact configuration of the present invention at minimum design temperature, with an IC installed.
Figure 4C:
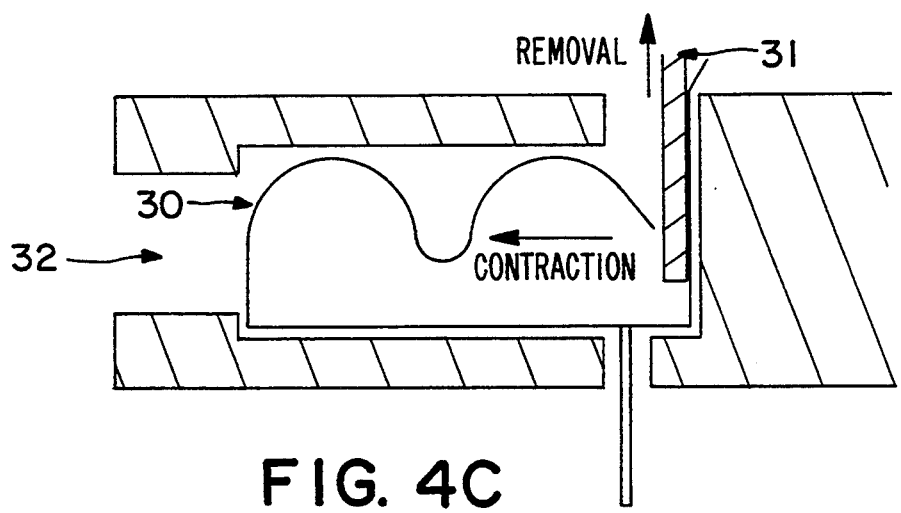
FIG. 4C shows a contact configuration of the present invention at IC removal temperature.

The IC is removed from the socket by cooling the socket below the design minimum temperature. As shown in FIG. 4C, the bimetallic contact retracts (30) due to the cooling and the grip on the IC lead is released. The IC can then be removed without damaging the IC or the socket contacts. The IC lead (31) can be inserted into this new socket contact design at any temperature since the spring contact design allows easy entry of the IC lead. This property facilitates economical assembly of circuits. FIGS. 4A and 4B show the contact configuration at the minimum design temperature, and FIG. 4C shows the contact at the socket release temperature.

The key to the design of the bimetallic contact is to obtain the desired deflection over the temperature range available for contact release. The contact must retain its grip on the IC lead over the design temperature range of the circuit but must release its grip in the range of temperatures from the minimum allowable IC temperature to the bottom of the circuit design temperature range. The temperature ranges of currently available IC's are:

| Industrial | −25° C. to +85° C. |

| | -continued |
|---|---|
| Military | −55° C. to +125° C. |

A representative minimum design temperature for electrical equipment is +5° C. (+40° F.), though lower temperatures can be used. In this example, the release temperature range for the socket design is:

| Industrial | −25° C. to +5° C. |
|---|---|
| Military | −55° C. to +5° C. |

Socket cooling for IC release was chosen over socket heating since the IC itself can operate up to the IC temperature limits, at least in certain cases. Therefore, no safe release temperature range would exist for release by heating. Designing for release after cooling also allows the grip on the IC leads to improve as the IC heats up during normal operation.

Cooling can be performed by spraying the socket with a readily available refrigerant such as refrigerant-12. As shown in FIG. 3A, cooling slots (32) are cast in the sides of the contact to permit the refrigerant to reach the contacts. The refrigerant should be chosen such that its boiling point is above the minimum allowable IC temperature to prevent IC damage due to excessive cooling. To minimize the possibility of damage to the IC from thermal shock, temperature sensitive paints or crayons can be used on the IC surface to signify when the IC has cooled sufficiently in air for the refrigerant cooling to begin.

A preliminary and currently preferred embodiment of this invention is according to FIGS. 3A and 3B with the following dimensions and parameters:

| Circuit minimum temperature = +5° C. |
|---|
| IC minimum temperature = −55° C. |
| Refrigerant boiling temperature = −29° C. (Refr. −12) |
| IC lead thickness = .025 inch |
| Bimetal materials = aluminum/ni-steel |
| Metal thickness = .003 inch each |
| Wave contact length = .300 inch |

For the above release temperature range (+5° C. to −29° C.) the contact retracts 0.026 inches. This contraction is enough to release completely the preload on the IC lead. If greater contraction is required for a particular application, additional "half-wave" shapes can be added to the contact. The semicircle contact shape was chosen to obtain a high ratio of temperature deflection to contact space. A high ratio minimizes the contact recess size and therefore the socket size. The footprint of the socket design of the present embodiment of this invention is somewhat larger than that of the prior art sockets; for example, a 16 pin conventional socket footprint is 0.4 in by 0.8 in. The socket of the current embodiment would be approximately 0.8 in by 0.8 in. It is believed that further application of techniques known to those skilled in the art will bring the dimensions of the socket of this invention down to the size of prior art sockets.

I claim:

1. A reusable vibration and shock resistant electrical contact for connecting integrated-circuit leads to balance of circuit components, comprising:
    a bimetallic contact with a barbed end, fabricated with a contact shape such that the barb end protracts with increasing temperature and retracts with decreasing temperature, said barb end pointing toward the direction of insertion of an integrated circuit lead so as to prevent by mechanical force of the barb end against said circuit lead the pulling out of the lead from the contact when the barb end is protracted and said retracting with decreasing temperature being sufficient to disengage the barbed end from the integrated circuit lead below a designed removal temperature;

a conducting base with one end connected rigidly to said bimetallic contact;

a tab connected rigidly to a second end of said base in such a manner that the barb end of the bimetallic contact and the tab form an integrated circuit lead-insertion-region with the barb just touching the tab at minimum design temperature; and a contact extension protruding from the under side of said base for making electrical contact with balance-of-circuit components;

said bimetallic contact, said base, said tab, and said contact extension being configured so as to seat rigidly in a mounting recess in a non-conducting socket body.

2. A reusable shock and vibration resistant integrated-circuit mounting socket comprising:

a body thin in one dimension and of generally rectangular shape in the other two dimensions and having two large rectangular sides and at least two corresponding elongated narrow sides, said body being fabricated from a non-conducting material with a plurality of recesses on a first large rectangular side which recesses are configured to receive reusable shock and vibration resistant contacts, said recesses communicating through small openings to the second rectangular side in such a way that a contact extension can pass through to make electrical connection to balance-of-circuit components; a plurality of bimetallic reusable shock and vibration resistant electrical contacts located in said recesses, each of said bimetallic contacts having a barbed end, fabricated with a contact shape such that the barb end protracts with increasing temperature and retracts with decreasing temperature, said barb end pointing toward the direction of insertion of an integrated circuit lead so as to prevent by mechanical force of the barb end against said circuit lead the pulling out of the lead from the contact when the barb end is protracted and said retracting with decreasing temperature being sufficient to disengage the barbed end from the integrated circuit lead below a designated removal temperature, and each said contact having a contact extension passing through to the second rectangular side of the body; and a plurality of cooling vents in the elongated narrow sides of the body adjacent to each of said contacts so as to allow cooling gas or liquid to come in contact with said electrical contacts.

* * * * *